(12) United States Patent
Kastenmeier et al.

(10) Patent No.: US 7,943,453 B2
(45) Date of Patent: May 17, 2011

(54) CMOS DEVICES WITH DIFFERENT METALS IN GATE ELECTRODES USING SPIN ON LOW-K MATERIAL AS HARD MASK

(75) Inventors: Bernd Ernst Eduard Kastenmeier, Austin, TX (US); Byoung Hun Lee, Wappingers Falls, NY (US); Naim Moumen, Walden, NY (US); Theodorus Eduardus Standaert, Pine Bush, NY (US)

(73) Assignee: International Business Machines Corporation, Armonk, NY (US)

( * ) Notice: Subject to any disclaimer, the term of this patent is extended or adjusted under 35 U.S.C. 154(b) by 567 days.

(21) Appl. No.: 11/960,881

(22) Filed: Dec. 20, 2007

(65) Prior Publication Data
US 2009/0159991 A1    Jun. 25, 2009

(51) Int. Cl.
*H01L 21/8238* (2006.01)

(52) U.S. Cl. ........ 438/199; 438/267; 438/277; 257/369; 257/E21.421; 257/E21.623

(58) Field of Classification Search .................. 438/199, 438/267, 277; 257/E21.623
See application file for complete search history.

(56) References Cited

U.S. PATENT DOCUMENTS

| | | | |
|---|---|---|---|
| 5,387,529 A | 2/1995 | Oku | |
| 6,552,377 B1 * | 4/2003 | Yu | 257/288 |
| 6,603,204 B2 | 8/2003 | Gates et al. | |
| 6,864,163 B1 * | 3/2005 | Yu et al. | 438/585 |
| 6,972,262 B2 | 12/2005 | Lee et al. | |
| 7,078,296 B2 | 7/2006 | Chau et al. | |
| 7,122,414 B2 * | 10/2006 | Huotari | 438/199 |
| 7,510,943 B2 * | 3/2009 | Li | 438/301 |
| 2004/0065903 A1 * | 4/2004 | Zheng et al. | 257/200 |

* cited by examiner

*Primary Examiner* — Kenneth A Parker
*Assistant Examiner* — Jose R Diaz
(74) *Attorney, Agent, or Firm* — Schmeiser, Olsen & Watts; Anthony J. Canale

(57) ABSTRACT

A semiconductor structure and a method of forming the same. The semiconductor structure includes a semiconductor substrate, a gate dielectric layer on top of the semiconductor substrate. The structure also includes a first metal containing region on top of the gate dielectric layer. The structure also includes a second metal containing region on top of the gate dielectric layer wherein the first and second metal containing regions are in direct physical contact with each other. The structure further includes a gate electrode layer on top of both the first and second metal containing regions and the gate electrode layer is in direct physical contact with both the first and second metal containing regions. The structure further includes a patterned photoresist layer on top of the gate electrode layer.

13 Claims, 4 Drawing Sheets

US 7,943,453 B2

CMOS DEVICES WITH DIFFERENT METALS IN GATE ELECTRODES USING SPIN ON LOW-K MATERIAL AS HARD MASK

TECHNICAL FIELD

The present invention relates to CMOS (Complementary Metal Oxide Semiconductor) devices, and more specifically, to CMOS devices having different metals in gate electrodes.

RELATED ART

In a typical CMOS device, there are an n-channel transistor and a p-channel transistor electrically coupled together. To enhance the performance of the CMOS device, there is a need to scale the equivalent oxide thickness (EOT) to 1 nm, the scaling of the gate oxide will require high-k oxide materials and metals to replace N-poly and P-poly. Therefore, there is a need for a structure (and a method of forming the same) in which the gate electrodes of the two transistors have a lower resistance than those of the prior act.

SUMMARY OF THE INVENTION

The present invention provides a semiconductor structure, comprising (a) a semiconductor substrate; (b) a gate dielectric layer on top of the semiconductor substrate; (c) a first metal containing region on top of the gate dielectric layer; (d) a second metal containing region on top of the gate dielectric layer, wherein the first and second metal containing regions are in direct physical contact with each other; (e) a gate electrode layer (i) on top of both the first and second metal containing regions and (ii) in direct physical contact with both the first and second metal containing regions; and (f) a patterned photoresist layer on top of the gate electrode layer.

The present invention provides a semiconductor structure fabrication method, comprising providing a semiconductor structure which includes (a) a semiconductor substrate, (b) a gate dielectric layer on top of the semiconductor substrate, (c) a first metal containing region on top of the gate dielectric layer, and (d) a first patterned mask layer on top of the first metal containing region; and forming a second metal containing layer on top of and in direct physical contact with both the first metal containing region and the first patterned mask layer.

The present invention provides a structure (and a method of forming the same) in which the gate electrodes of the transistors have a two metals, one metal for NMOS and one for PMOS and lower resistance than those of the prior art.

DETAILED DESCRIPTION OF THE INVENTION

FIGS. 1-11 illustrate a fabrication process for forming a semiconductor structure 100, in accordance with embodiments of the present invention.

Figure 1:
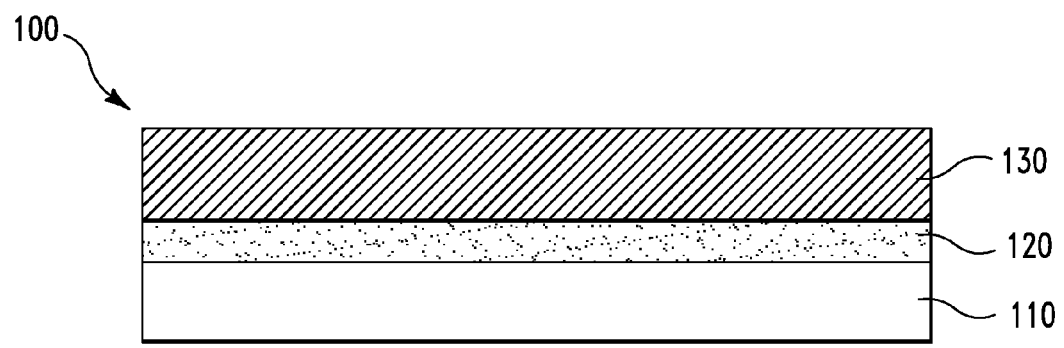
FIGS. 1-11 illustrate a fabrication process for forming a semiconductor structure, in accordance with embodiments of the present invention.

More specifically, in one embodiment, with reference to FIG. 1, the fabrication process starts with a semiconductor (e.g., silicon, germanium, etc.) substrate 110.

Next, a gate dielectric layer 120 is formed on top of the semiconductor substrate 110. Illustratively, the gate dielectric layer 120 comprises a high-K dielectric material, wherein K is dielectric constant and is higher than 3.9 (e.g., $HfO_2$). In one embodiment, the gate dielectric layer 120 is formed by CVD (Chemical Vapor Deposition) or ALD (atomic layer deposition).

Next, in one embodiment, a first metal containing layer 130 is formed on top of the gate dielectric layer 120. Illustratively, the first metal containing layer 130 comprises a pure metal (e.g., tungsten), a metal silicide (e.g., NiSi), or a metal nitride (e.g., TaN or TiN). In one embodiment, the first metal containing layer 130 is formed by CVD, ALD (Atomic Layer Deposition), or any other deposition techniques.

Figure 2:
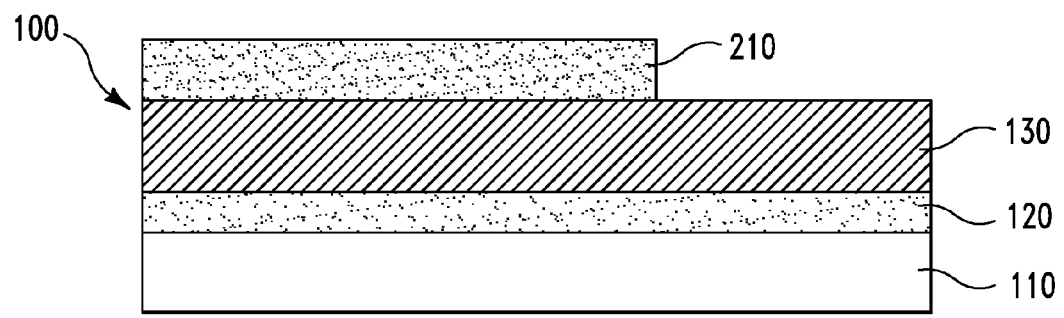

Next, in one embodiment, with reference to FIG. 2, a first patterned mask layer 210 is formed on top of the first metal containing layer 130. Illustratively, the first patterned mask layer 210 comprises a low-K dielectric material (e.g., SiLK material from DOW chemical corporation). In one embodiment, the first patterned mask layer 210 is formed by a spin-on process (this process may involve curing at, illustratively, 100° C.-200° C. to evaporate all solvent) followed by a lithographic and etching step.

Next, in one embodiment, the first patterned mask layer 210 is used as a mask for directionally and selectively etching the first metal containing layer 130 stopping at the gate dielectric layer 120. As a result, portions of the first metal containing layer 130 which are not covered by the first patterned mask layer 210, are removed, resulting in the structure 100 of FIG. 3 In one embodiment, the directional and selective etching of the first metal containing layer 130 also etches the first patterned mask layer 210, resulting in the first patterned mask layer 210 becoming thinner.

Figure 3:
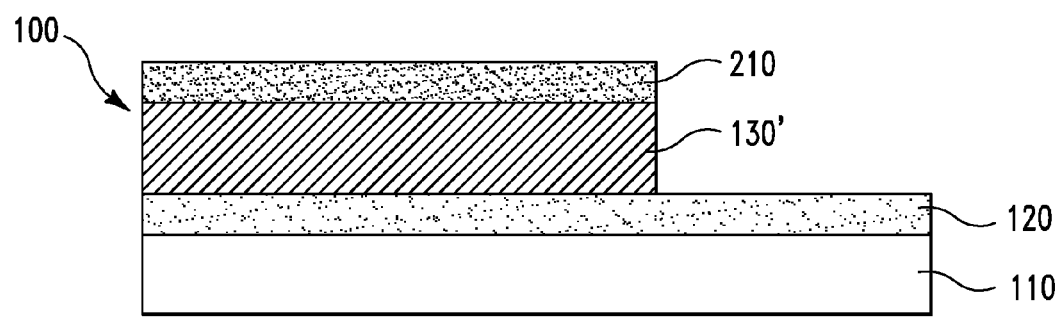

With reference to FIG. 3, as a result of the directional and selective etching of the first metal containing layer 130 of FIG. 2, what remains of the first metal containing layer 130 of FIG. 2 is a first metal containing region 130'.

Figure 4:
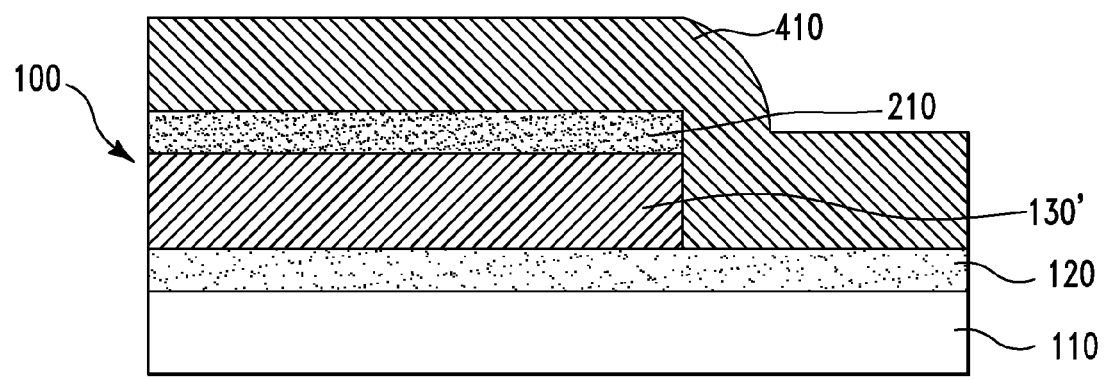

Next, in one embodiment, with reference to FIG. 4, a second metal containing layer 410 is formed on top of the structure 100 of FIG. 3. Illustratively, the second metal containing layer 410 comprises a pure metal (e.g., tungsten), a metal silicide (e.g., NiSi) or a metal nitride (e.g., TaN or TiN). In one embodiment, the material of the first metal containing region 130' is different from the material of the second metal containing layer 410. Illustratively, the work function of the material of the first metal containing region 130' is different from the work function of the material of the second metal containing layers 410. In one embodiment, the second metal containing layer 410 is formed by CVD or ALD, or any other deposition techniques.

Figure 5:
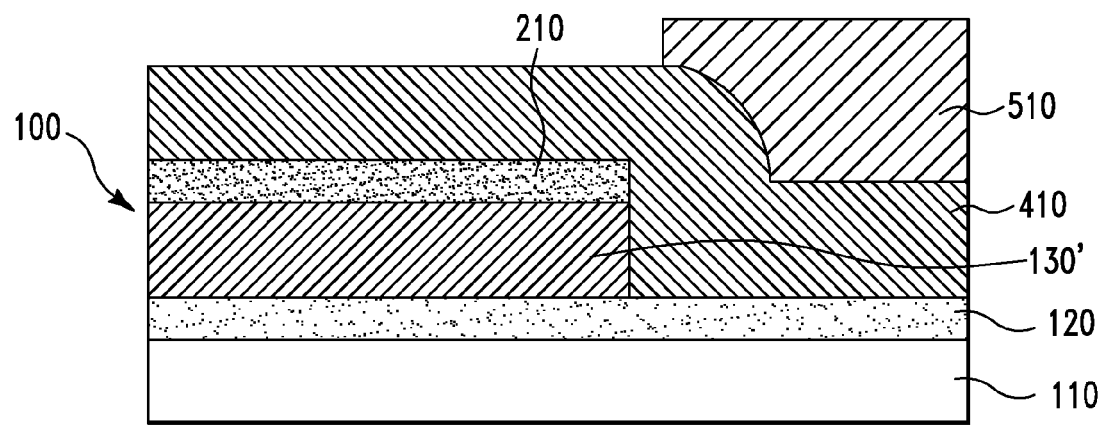

Next, with reference to FIG. 5, a second patterned mask layer 510 is formed on top of the second metal containing layer 410, but not directly above the first metal containing region 130' (i.e., not overlapping the first metal containing region 130'). Illustratively, the second patterned mask layer 510 comprises a low-K dielectric material (e.g., SiLK material from DOW chemical corporation). In one embodiment, the second patterned mask layer 510 is formed by a spin-on process (this process may involve curing at, illustratively, 100° C.-200° C. to evaporate all solvent) followed by a lithographic and etching step.

Next, in one embodiment, the second patterned mask layer 510 is used as a mask for directionally and selectively etching the second containing metal layer 410 stopping at the gate dielectric layer 210. As a result, portions of the metal containing layer 410 which are not covered by the second mask layer 510 are removed, resulting in the structure 100 of FIG. 6. In one embodiment, the directional and selective etching of the second metal containing layer 410 also etches the first and the second patterned mask layer 210 and 510, resulting in the first and the second patterned mask layers 210 and 510 becoming thinner.

Figure 6:
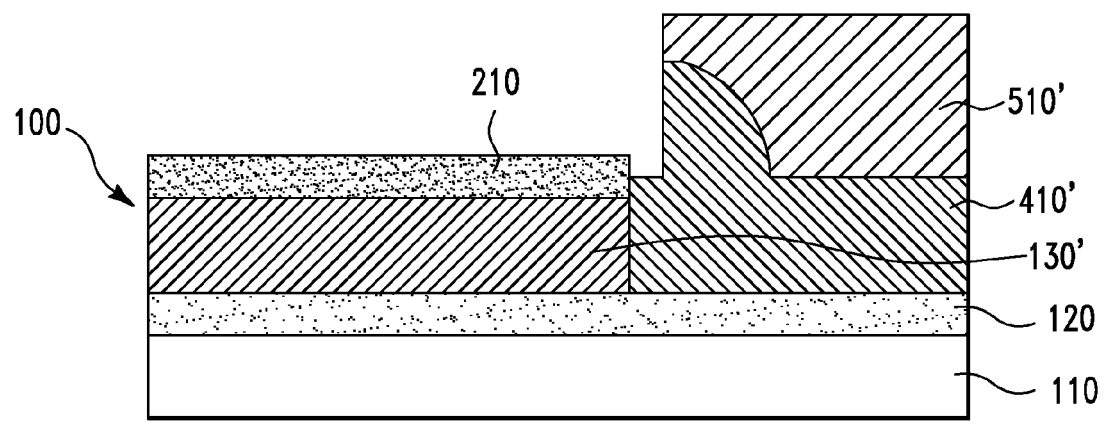

With reference to FIG. 6, as a result of the directional and selective etching of the second metal containing layer 410 of FIG. 5, what remains of the second metal containing layer 410 of FIG. 5 is a second metal containing region 410'.

Figure 7:
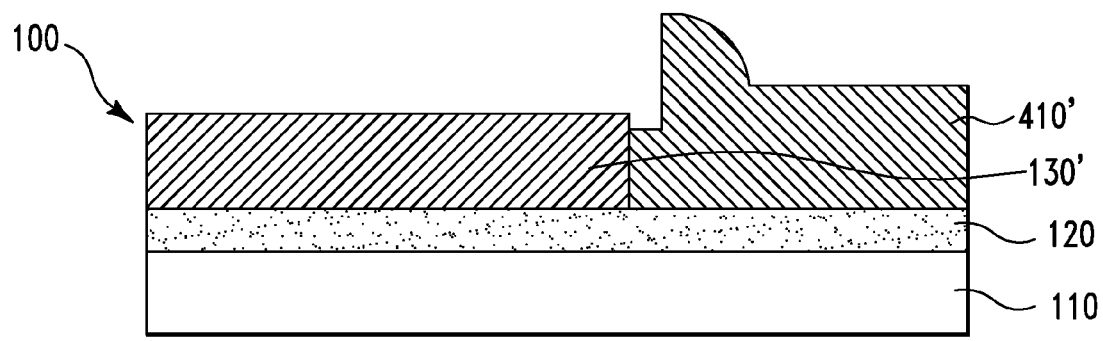

Next, in one embodiment, the first patterned mask layer 210 and the second patterned mask layer 510 are removed by wet etching, resulting in the structure 100 of FIG. 7.

Figure 8:
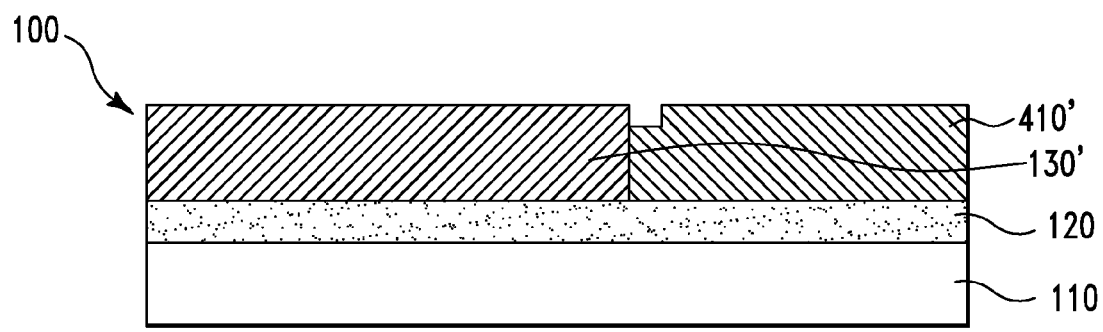

Next, in one embodiment, a CMP (Chemical Mechanical Polishing) process is performed to make the top surfaces of the first metal containing region 130' and the second metal containing region 410' essentially coplanar, resulting in the structure 100 of FIG. 8.

Figure 9:
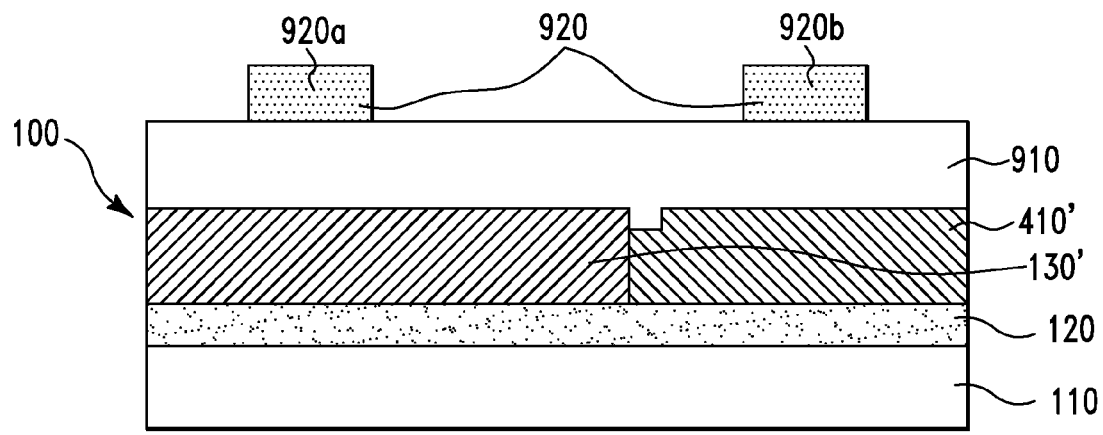

Next, with reference to FIG. 9, in one embodiment, a gate electrode layer 910 is formed on top of the structure 100 of FIG. 8. Illustratively, the gate electrode layer 910 comprises polysilicon. In one embodiment, the gate electrode layer 910 is formed by CVD.

Next, in one embodiment, a patterned photoresist layer 920 is formed on top of the gate electrode layer 910. Illustratively, the patterned photo resist layer 920 comprises two photoresist regions 920A and 920B which overlap the first and the second metal containing regions 130' and 410', respectively. In one embodiment, the patterned photoresist layer 920 is formed by a conventional lithographic process.

Next, in one embodiment, the patterned photo resist layer 920 is used as a mask for directionally and selectively etching the gate electrode layer 910 and the first and the second metal containing regions 130' and 410'. This etching process stops at the high-K gate dielectric layer 120, resulting in the structure 100 of FIG. 10.

Figure 10:
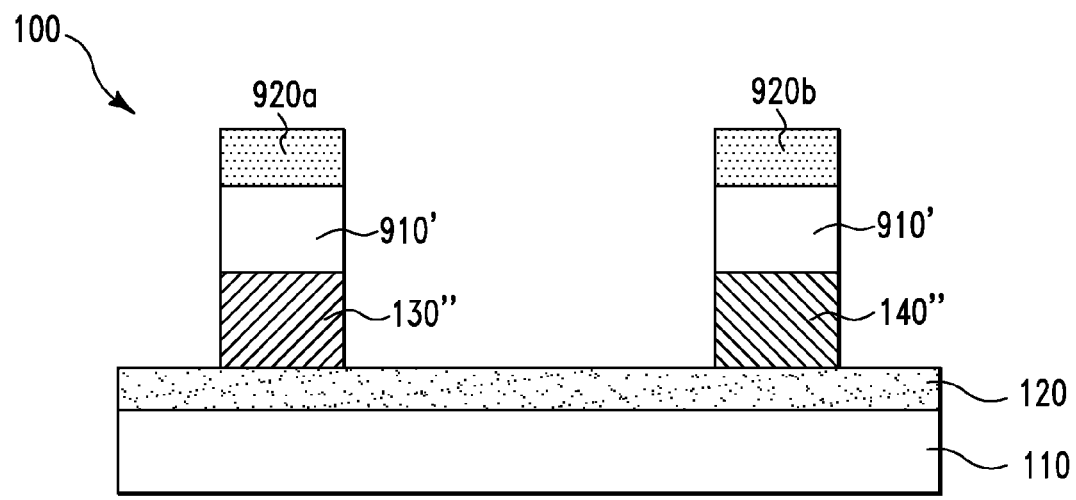

Next, with reference to FIG. 10, what remains of the first metal containing region 130' is a first metal containing region 130" and what remains of the second metal containing region 140' is a second metal containing region 140". Next, in one embodiment, the two regions 920A and 920B of the patterned photo resist layer 920 are removed by a wet etching step, resulting in the structure 100 of FIG. 11.

Next, with reference to FIG. 1, in one embodiment, the two gate stacks 1110A and 1110B can be used as two blocking masks in a fabrication process which is performed to fabricate two transistors in the silicon substrate 110. It should be noted that, one of the two fabricated transistors can be an n-channel transistor and the other can be a p-channel transistor. In one embodiment, the work function of the material of the first metal containing region 130" (corresponding to the p-channel transistor) should be higher than the work function of the material of the second metal containing region 140" (corresponding to the n-channel transistor). Illustratively, the work function of the material of the first metal containing region 130" may be 5 keV and the work function of the material of the second metal containing region 140" may be 4 keV. In one embodiment, the two transistors can be connected to form a CMOS (Complementary Metal Oxide Semiconductor) device.

Figure 11:
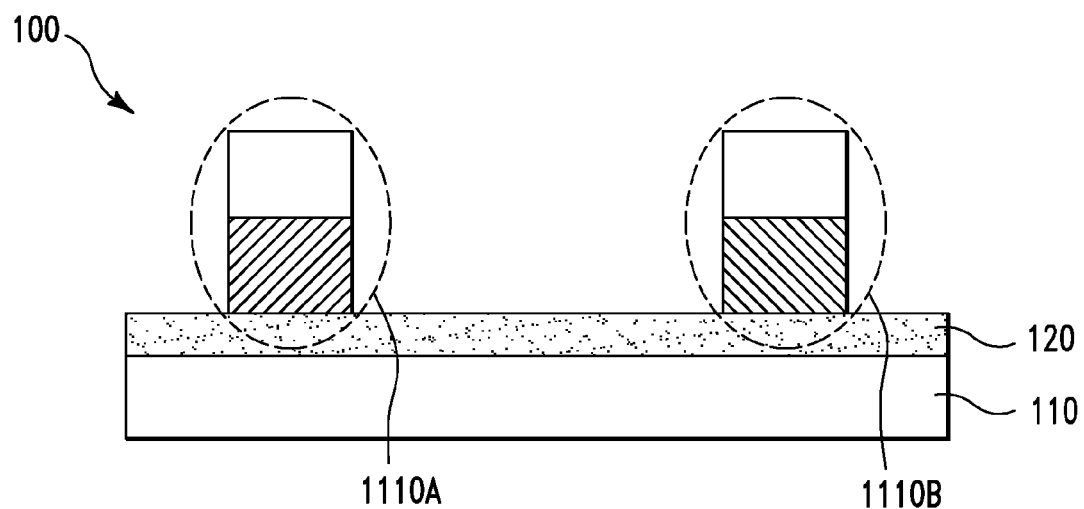

In summary, with reference to FIG. 2, the first patterned mask layer 210 is used as a mask to etch the first metal containing layer 130. Because the first patterned mask layer 210 comprises a low-K material and is formed by spin-on process at a low temperature, therefore, the etching of the first metal containing layer 130 stop at the high-K gate dielectric layer 120 without damage to the high-K gate dielectric layer 120. With reference to FIG. 5, the second patterned mask layer 510 is used as a mask to etch the second metal containing layer 410. With reference to FIG. 9, the patterned photo resist layer 920 is used as a mask to form the two gate stacks 1110A and 1110B. With reference to FIG. 11, the two gate stacks 1110A and 1110B are used as two blocking masks to form two transistors in the silicon substrate 110. The two transistors can be connected to form a CMOS device.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. A semiconductor structure fabrication method, comprising:
   providing a semiconductor structure which includes (a) a semiconductor substrate, (b) a gate dielectric layer on top of and in direct physical contact with the semiconductor substrate at a surface of the semiconductor substrate, (c) a first metal containing region on top of and in direct physical contact with the gate dielectric layer, and (d) a first patterned mask layer on top of and in direct physical contact with the first metal containing region; and
   forming a second metal containing layer on top of and in direct physical contact with the first metal containing region, the first patterned mask layer, and the gate dielectric layer,
   wherein said forming the second metal containing layer results in the second metal containing layer being in direct physical contact with a surface of the first metal containing region, and wherein the surface of the first metal containing region is perpendicular to the surface of the semiconductor substrate.

2. The method of claim 1, wherein the first patterned mask layer comprises a low-k material.

3. The method of claim 1,
   wherein the first metal containing region comprises a first material selected from the group consisting of a pure metal, a metal silicide, and a metal nitride,
   wherein the second metal containing region comprises a second material selected from the group consisting of a pure metal, a metal silicide, and a metal nitride, and
   wherein the first material is different from the second material.

4. The method of claim 3,
   wherein the first work function of the first material is about 5 keV, and
   wherein the second work function of the second material is about 4 keV.

5. The method of claim 1, wherein said forming the second metal containing layer results in the second metal containing layer consisting of first portions and a remaining portion, said method further comprising:
   removing the first portions of the second metal containing layer such that the remaining portion of the second metal containing layer does not overlap the first metal containing region in a direction that is perpendicular to the surface of the semiconductor substrate; and
   after said removing the first portions of the second metal containing layer is performed, completely removing the first patterned mask layer.

6. The method of claim 1, wherein said forming the second metal containing layer results in the second metal containing layer consisting of first portions and a remaining portion, said method further comprising:

removing the first portions of the second metal containing layer such that the remaining portion of the second metal containing layer does not overlap the first metal containing region in a direction that is perpendicular to the surface of the semiconductor substrate; and after said removing the first portions of the second metal containing layer is performed, completely removing the first patterned mask layer.

7. The method of claim 1, wherein said removing the first portions of the second metal containing layer results in the remaining portion of the second metal containing layer being in direct physical contact with the surface of the first metal containing region, the first patterned mask layer, and the gate dielectric layer.

8. A semiconductor structure fabrication method, comprising:

providing a semiconductor structure which includes (a) a semiconductor substrate, (b) a gate dielectric layer on top of the semiconductor substrate, (c) a first metal containing region on top of the gate dielectric layer, and (d) a first patterned mask layer on top of the first metal containing region;

forming a second metal containing layer on top of and in direct physical contact with both the first metal containing region and the first patterned mask layer;

removing portions of the second metal containing layer such that the resulting second metal containing layer is not overlapping the first metal containing region; and after said removing the portions of the second metal containing layer is performed, completely removing the first patterned mask layer, wherein said removing the portions of the second metal containing layer comprises:

forming a second patterned mask layer on top of the second metal containing layer but not overlapping the first metal containing region, wherein the second patterned mask layer comprises a low-k material; and using the second patterned mask layer as a mask to selectively etch the second metal containing layer.

9. A semiconductor structure fabrication method, comprising:

providing a semiconductor structure which includes (a) a semiconductor substrate, (b) a gate dielectric layer on top of the semiconductor substrate, (c) a first metal containing region on top of the gate dielectric layer, and (d) a first patterned mask layer on top of the first metal containing region;

forming a second metal containing layer on top of and in direct physical contact with both the first metal containing region and the first patterned mask layer;

removing portions of the second metal containing layer such that the resulting second metal containing layer is not overlapping the first metal containing region;

after said removing the portions of the second metal containing layer is performed, completely removing the first patterned mask layer; and after said completely removing the first patterned mask layer is performed, performing a CMP (Chemical Mechanical Polishing) process to make a first top surface of the first metal containing region and a second top surface of the second metal containing region essentially coplanar.

10. The method of claim 9, further comprising:

after said the CMP process is performed, forming a gate electrode layer on top of both the first and second top surfaces.

11. The method of claim 10, further comprising:

after said forming the gate electrode layer is performed, forming a patterned photoresist layer on top of the gate electrode layer, wherein the patterned photoresist layer comprises a first photoresist region and a second photoresist region, and wherein the first and second photoresist regions are overlapping the first and second metal containing regions, respectively.

12. The method of claim 11, further comprising:

using the first and second photoresist regions as a mask to selectively and directionally etch the gate electrode layer and then the first and second metal containing regions resulting in a first gate stack and a second gate stack, respectively.

13. The method of claim 12, further comprising:

using the first gate stack and the second gate stack to form a first transistor and a second transistor, respectively, in the semiconductor substrate, wherein the first transistor is an n-channel transistor, wherein the second transistor is a p-channel transistor, and wherein the first and second transistors are connected resulting in a CMOS (Complementary Metal Oxide Semiconductor) device.

\* \* \* \* \*